(12) United States Patent
Holm (10) Patent No.: US 10,878,857 B2
(45) Date of Patent: Dec. 29, 2020

(54) DYNAMIC DATA STORAGE ELEMENT, AND INTEGRATED CIRCUIT HAVING THE SAME

(71) Applicant: BITMAIN INC., San Jose, CA (US)

(72) Inventor: Peter Douglas Holm, Seattle, WA (US)

(73) Assignee: BITMAIN INC., San Jose, CA (US)

( * ) Notice: Subject to any disclaimer, the term of this patent is extended or adjusted under 35 U.S.C. 154(b) by 0 days.

(21) Appl. No.: 16/673,124

(22) Filed: Nov. 4, 2019

(65) Prior Publication Data

US 2020/0143851 A1 May 7, 2020

Related U.S. Application Data

(60) Provisional application No. 62/755,259, filed on Nov. 2, 2018.

(51) Int. Cl.
| | |
|---|---|
| *G11C 7/00* | (2006.01) |
| *G11C 7/06* | (2006.01) |
| *G11C 7/22* | (2006.01) |
| *G11C 7/10* | (2006.01) |

(52) U.S. Cl.
CPC .............. *G11C 7/065* (2013.01); *G11C 7/106* (2013.01); *G11C 7/1087* (2013.01); *G11C 7/222* (2013.01)

(58) Field of Classification Search
CPC ..... G11C 7/1006; G11C 11/406; G11C 15/04; G11C 15/043; G11C 11/419; G11C 5/144; G11C 5/148; G11C 8/06; G11C 7/065; G11C 7/106; G11C 7/1087; G11C 7/1093; G11C 7/222; G11C 7/10; G11C 7/00; G11C 8/18; G11C 8/00; G11C 11/00; G11C 11/22; G11C 11/416; G11C 7/02

See application file for complete search history.

(56) References Cited

U.S. PATENT DOCUMENTS

2007/0174597 A1* 7/2007 Joy ..................... G06F 9/30141
712/228

* cited by examiner

*Primary Examiner* — Thong Q Le
(74) *Attorney, Agent, or Firm* — Anova Law Group, PLLC (57) ABSTRACT

A data storage device includes a dynamic latch circuit. The dynamic latch circuit includes a first NMOS transistor, a second NMOS transistor, a first PMOS transistor, and a second PMOS transistor. A source terminal of the first NMOS transistor is connected to a source terminal of the first PMOS transistor to form a data input terminal. A drain terminal of the first NMOS transistor is connected to a drain terminal of the first PMOS transistor to form a latch internal node. A gate terminal of the first NMOS transistor is connected to a clock input signal. A gate terminal of the first PMOS transistor is connected to an inverse clock input signal. A gate terminal of the second NMOS transistor and a gate terminal of the second PMOS transistor are connected to the latch internal node. A drain terminal of the second NMOS transistor and a drain terminal of the second PMOS transistor are connected to form an inverted output terminal.

18 Claims, 12 Drawing Sheets

DYNAMIC DATA STORAGE ELEMENT, AND INTEGRATED CIRCUIT HAVING THE SAME

CROSS-REFERENCE TO RELATED APPLICATION

This application claims the priority of U. S. Provisional Patent Application No. 62/755,259, titled "SYSTEMS AND METHODS FOR CHIPS INCLUDING LOW-VOLTAGE DATA STORAGE ELEMENTS", filed on Nov. 2, 2018, the entire contents of which are incorporated herein by reference.

TECHNICAL FIELD

The present disclosure relates to the technical field of data storage elements for integrated circuits (ICs), in particular to low-voltage data storage elements.

BACKGROUND

With the rapid development in large-scale computing, as well as global awareness of environmental protection and energy conservation, energy efficiency has become an important aspect in the design and development of hardware computing systems. At present, data storage elements in electronic computing devices typically use static latch and flip-flop circuits to retain information in the circuit. A static latch has a feedback path that keeps a static state of the latch during its opaque operation mode, so a data bit can be stored in the static latch. However, the static property comes at the cost of the additional feedback transistors, which require being powered during operation. When a computing device includes a large number of data storage elements, the feedback transistors in the static latches may consume a considerable amount of power, reducing power efficiencies of the computing device.

The embodiments of the present disclosure address the limitations of existing data storage elements.

SUMMARY

In one aspect of the present disclosure, a data storage device is provided. The data storage device includes a dynamic latch circuit. The dynamic latch circuit includes a first NMOS transistor, a second NMOS transistor, a first PMOS transistor, and a second PMOS transistor; a source terminal of the first NMOS transistor is connected to a source terminal of the first PMOS transistor to form a data input terminal; a drain terminal of the first NMOS transistor is connected to a drain terminal of the first PMOS transistor to form a latch internal node; a gate terminal of the first NMOS transistor is connected to a clock input signal; a gate terminal of the first PMOS transistor is connected to an inverse clock input signal; a gate terminal of the second NMOS transistor and a gate terminal of the second PMOS transistor are connected to the latch internal node; and a drain terminal of the second NMOS transistor and a drain terminal of the second PMOS transistor are connected to form an inverted output terminal.

In certain embodiments, the dynamic latch circuit is configured to read a signal from the data input terminal and pass a logic state of the read signal to the latch internal node when the clock input signal has a high logic state.

In certain embodiments, the dynamic latch circuit is configured to store the logic state of the read signal at the latch internal node for a finite period of time.

In certain embodiments, the finite period of time is determined according to leakage properties of the first NMOS transistor and the first PMOS transistor.

In certain embodiments, the dynamic latch circuit is a first dynamic latch circuit; the data storage device further comprises a second dynamic latch circuit; and the first dynamic latch circuit and the second dynamic latch circuit form a dynamic flip-flop circuit.

In certain embodiments, the dynamic flip-flop circuit is configured to read a signal from the data input terminal of the first dynamic latch circuit at a positive or negative edge of the clock input signal.

In another aspect of the present disclosure, another data storage device is provided. The data storage device includes a dynamic latch circuit. The dynamic latch circuit includes a first NMOS transistor, a second NMOS transistor, a third NMOS transistor, a first PMOS transistor, a second PMOS transistor, and a third PMOS transistor; the first NMOS transistor, the second NMOS transistor, the first PMOS transistor, and the second PMOS transistor are connected in series to from a pass-gate front-end circuit to pass a signal from a data input terminal to a latch internal node; a gate terminal of the third NMOS transistor and a gate terminal of the third PMOS transistor are connected to the latch internal node; and a drain terminal of the third NMOS transistor and a drain terminal of the third PMOS transistor are connected to form an output terminal.

In another aspect of the present disclosure, an integrated circuit (IC) chip is provided.

The integrated circuit chip includes a plurality of forgoing data storage elements.

In certain embodiments, the plurality of data storage elements are arranged in a plurality of circuit stages, each circuit stage having one of the data storage elements; the IC chip further comprises a plurality of clock delay buffer circuits; each circuit stage receives a clock signal from a corresponding clock delay buffer circuit to cause the plurality of data storage elements to be controlled by non-overlapping clock signals; and the plurality of circuit stages are sequentially connected to each other to pass data in a first direction.

In certain embodiments, the non-overlapping clock signals received by the plurality of circuit stages have a propagation direction opposite to the first direction.

In certain embodiments, the IC chip further includes a plurality of logic circuit elements connected to the plurality of data storage elements.

In certain embodiments, the IC chip is an ACIS chip customized for cryptocurrency mining calculations.

BRIEF DESCRIPTION OF THE DRAWINGS

In order to more clearly illustrate the technical solutions in the embodiments of the present disclosure, the drawings used in the description of the embodiments will be briefly described below. It is obvious that the drawings in the following description are only some embodiments of the present disclosure. Other drawings may be obtained by those of ordinary skill in the art based on these drawings.

DETAILED DESCRIPTION

Exemplary embodiments will be described in detail herein. These embodiments are illustrated in the accompanying drawings. In the following description, unless otherwise indicated, same or similar referral numerals may refer to the same or similar elements in different drawings. The implementation manners described in the following exemplary embodiments do not represent all embodiments of the present disclosure. Instead, they are merely examples of devices and methods consistent with aspects provided by the present disclosure as detailed in the claims.

Figure 1A:
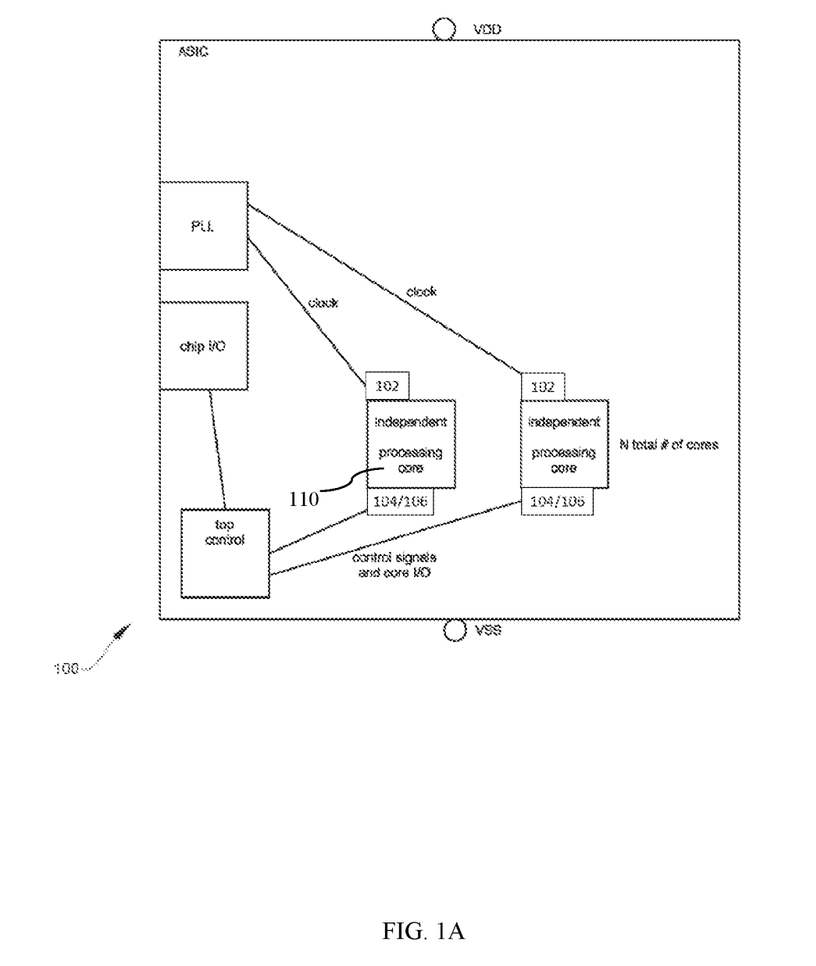
FIG. 1A is a diagram showing an IC chip according to some embodiments.

FIG. 1A is a diagram showing an integrated circuit (IC) chip 100 according to certain embodiments of the present disclosure. In certain embodiments, the IC chip 100 may be an application-specific integrated circuit (ASIC) chip customized for a particular use, such as being adapted for solving cryptographic hash functions for blockchain related applications. The IC chip 100 may include an input/output component (e.g., chip I/O), a phase-locked loop (PLL) component, a top control component, one or more independent processing cores, and two voltage terminals (e.g., VDD terminal and VSS terminal). In certain embodiments, the PLL component may be configured to generate one or more clock signals. The PLL component may further be configured to send the generated one or more clock signals to the one or more independent processing cores 110. An independent processing core may independently read and execute program instructions. An independent processing core may also be termed as a processing unit. In the present disclosure, the terms "independent processing core", "processing core", and "processing unit" may be used interchangeably. In certain embodiments, the IC chip 100 may include a plurality of processing cores (or processing units) 110. That is, IC chip 100 may be a multi-core processor. The total number of independent processing cores of the chip 100 may be N.

In some embodiments, each independent processing core 110 may be configured to receive, at a terminal 102, at least one of the one or more clock signals from the PLL component. Each independent processing core 110 may be further configured to receive, at terminal 104, signals from the top control component. In certain other embodiments, each independent processing core may be further configured to receive, at terminal 104, signals from another independent processing core. The received signals may include data signals, control signals and/or core input/output (I/O) signals. In certain embodiments, each independent processing core may be further configured to send, from terminal 106, signals to the top control component. In certain embodiments, the sent signals may include data signals, control signals and/or core I/O signals.

In certain embodiments, the top control component may be configured to receive signals from and/or send signals to each independent processing core. For examples, the received signals and/or sent signals may include data signals, control signals and/or core I/O signals. In certain embodiments, the top control component may further be configured to receive signals from and/or send signals to the input/output component. In certain embodiments, the received signals and/or sent signals may include data signals.

Figure 1B:
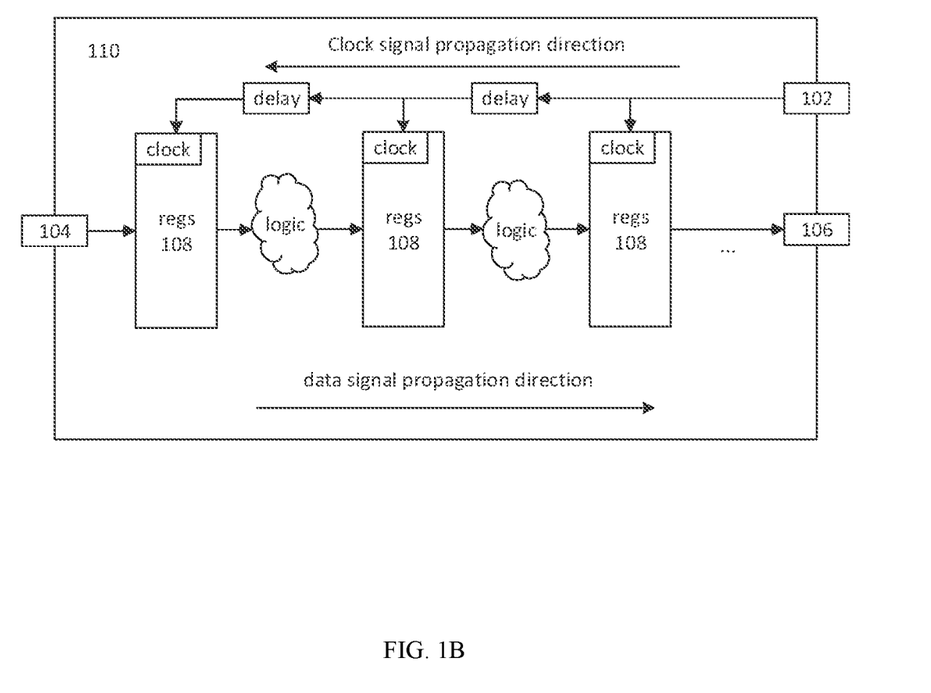
FIG. 1B is a diagram showing an IC chip according to some embodiments.

FIG. 1B is a diagram showing an independent processing core 110 according to certain embodiments of the present disclosure. In certain embodiments, the chip 100 may include one or more independent processing cores (or processing units) 110. The processing unit 110 may include one or more data registers 108. The data register 108 may include one or more data storage elements.

In certain embodiments, the processing core 110 may include a pipeline configured to process an input data stream. The pipeline may include a plurality of consecutive stages. In one example, the independent processing core may include 128 pipeline stages (e.g., stage 0, . . . , and stage 127). In certain embodiments, each pipeline stage may include a data register ("regs") 108. In certain embodiments, each pipeline stage may further include a logic component 109.

In certain embodiments, the register 108 and the logic component 109 of the first stage may be connected to the terminal 104 of the independent processing core and configured to receive data signals from the top control component through terminal 104. After being processed by the logic component 109 of the first stage, the data signals may be passed on to the register 108 and logic component 109 of the next stage, and so on, until the data signals are processed by the logic component 109 of the last stage and sent to terminal 106. According to certain embodiments, the processing core 110 may include one or more delay buffers for the clock signal. Clock signals may be delayed at each delay buffers before being sent to the data register 108 at the corresponding stage. As shown in FIG. 1B, the propagation direction of the clock signals may be opposite of the propagation direction of the data signals. That is, while the data signals propagate from the first stage to the last stage of the pipeline, the clock signals may propagate from the last stage to the first stage of the pipeline through the corresponding delay buffers at each stage.

According to certain embodiments, the logic component 109 of the last stage in the pipeline may be connected to terminal 106 of the independent processing core. In certain embodiments, the logic component 109 of the last stage may be configured to process the data received from the register of the last stage and send the processed data to the terminal 106 to be outputted to the top control component.

Figure 2A:
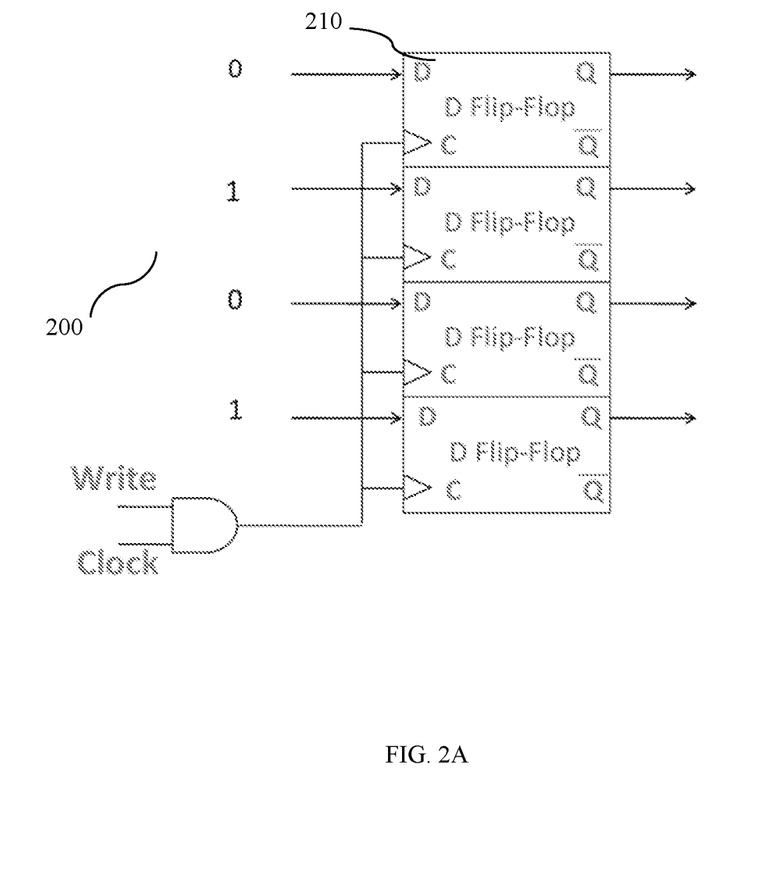
FIG. 2A is a diagram showing a data register according to some embodiments.

FIG. 2A shows an example of a data register 200. In certain embodiments, the data register 200 may include a plurality of D-type flip-flops (DFFs) 210. Each DFF may have a data input terminal (marked by D in FIG. 2A), a clock input terminal (marked by C in FIG. 2A), and a data output terminal Q (marked by Q in FIG. 2A). A clock signal received at the C terminal of the DFF 210 may be a pulsed clock signal. In certain embodiments, a rising edge of the pulsed clock signal may trigger the DFF to load data from the D terminal. For example, at a rising edge of clock signal, if the D terminal of a DFF receives a low voltage level (a binary "0"), the DFF will read the binary "0". If the previous state of the DFF is "1", it will be changed to "0" and kept at "0" for a period of time. Similarly, at a rising edge of clock signal, if the D terminal of a DFF receives a high voltage level (a binary "1"), the DFF will read the binary "1" and keep "1" state for a period of time. In contrast, if the voltage level at the D terminal changes from "0" to "1", or from "1" to "0" without the C terminal receiving a rising edge of the clock signal, the previous state of the DFF will not be changed. In summary, in certain embodiments, the DFF may be triggered by a rising edge of the clock signal to read a data input from its D terminal and keep the read data input for a period of time. In certain other embodiments, the DFF may be similarly triggered by a falling edge of the clock signal to read a data input from its D terminal and keep the read data input for a period of time.

Figure 2B:
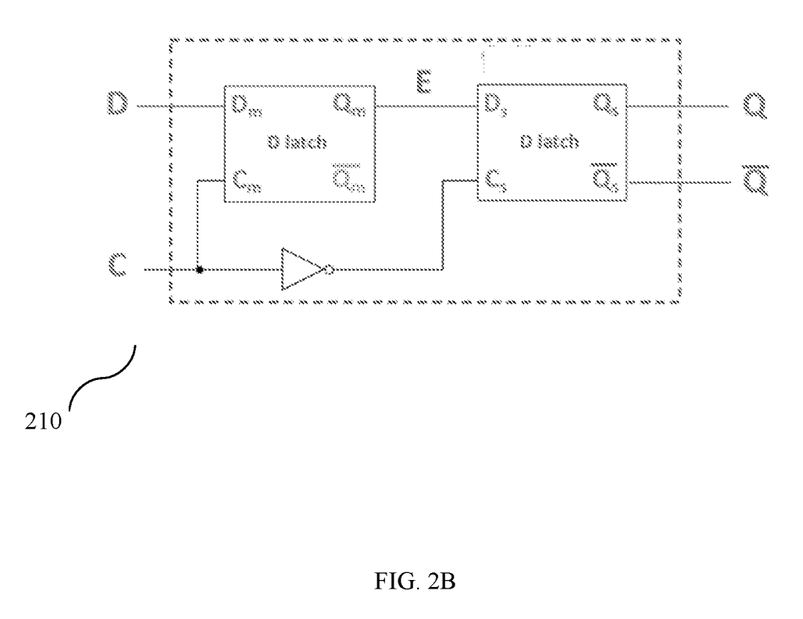
FIG. 2B is a diagram showing a flip-flop circuit according to some embodiments.

FIG. 2B shows a structure of a DFF 210 configured to be triggered by a falling edge of the clock signal. As shown in FIG. 2B, according to certain embodiments, the DFF 210 may include a first latch circuit 212 connected in series with a second latch circuit 214 having an opposite clock connection. The first latch circuit 212 may be termed as a "master" latch, and the second latch circuit 214 may be termed as a "slave" latch. The "master" latch 212 may include a data input terminal (marked by Dm), a clock input terminal (marked by Cm), and a data output terminal Q (marked by Qm). The "slave" latch 214 may include a data input terminal (marked by Ds), a clock input terminal (marked by Cs), and a data output terminal Q (marked by Qs). The master latch 212 and the slave latch 214 may be triggered by a high clock signal voltage (i.e., a binary "1" clock signal) to load data from their respective data input terminals. Since the slave 214 having an opposite clock connection, its state is updated to follow the output of the master latch 212 when the clock signal has a low voltage (i.e., a binary "0" clock signal). Thus, the output of the slave latch 214 is updated at the falling edge of the clock signal.

Figure 3A:
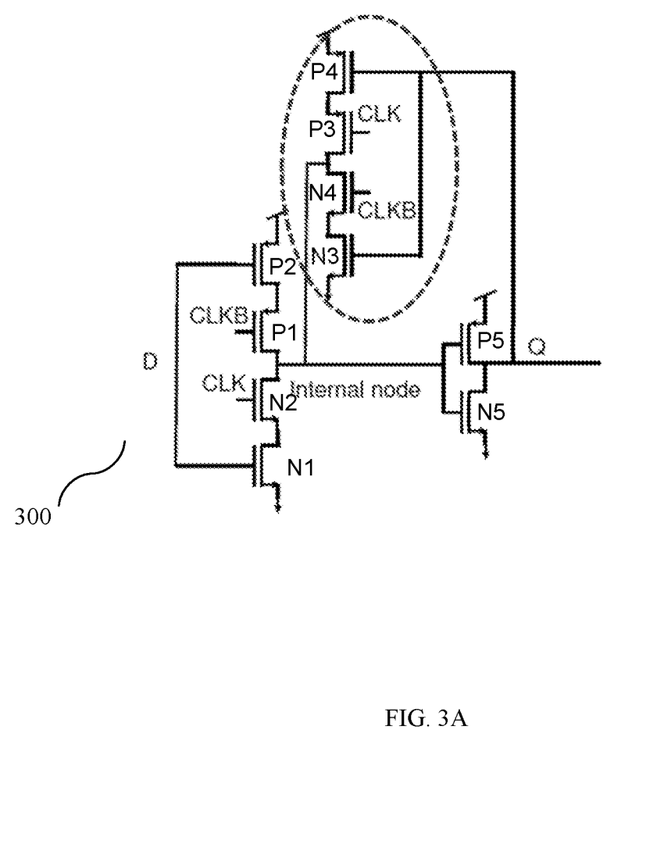
FIG. 3A is a diagram showing static latch circuit according to some embodiments.

FIG. 3A is a diagram illustrating a latch circuit 300 used in a register of an IC chip (e.g., ASIC chip) according to certain embodiments. As shown in FIG. 3A, the latch circuit 300 may include a data input terminal ("D"), a data output terminal ("Q"), a clock signal input terminal ("CLK"), and an inverted clock signal input terminal ("CLKB"). The static latch circuit 300 may further include 10 transistors P1-P5 and N1-N5. The static latch circuit 300 may be configured to load data from the data input terminal D when triggered by a high clock signal voltage (i.e., a binary "1" clock signal at the CLK terminal). The latch circuit 300 may be configured to hold its state during low clock signal voltage (i.e., a binary "0" clock signal at the CLK terminal). Thus, latch circuit 300 may be termed as static latch. It is noted that the static latch circuit 300 includes 10 transistors, including 4 transistors N3, N4, P3, and P4 in a feedback branch (as shown in the dashed-line circle) of the circuit. The feedback branch causes the latch circuit to hold data stably until new data is loaded.

Figure 3B:
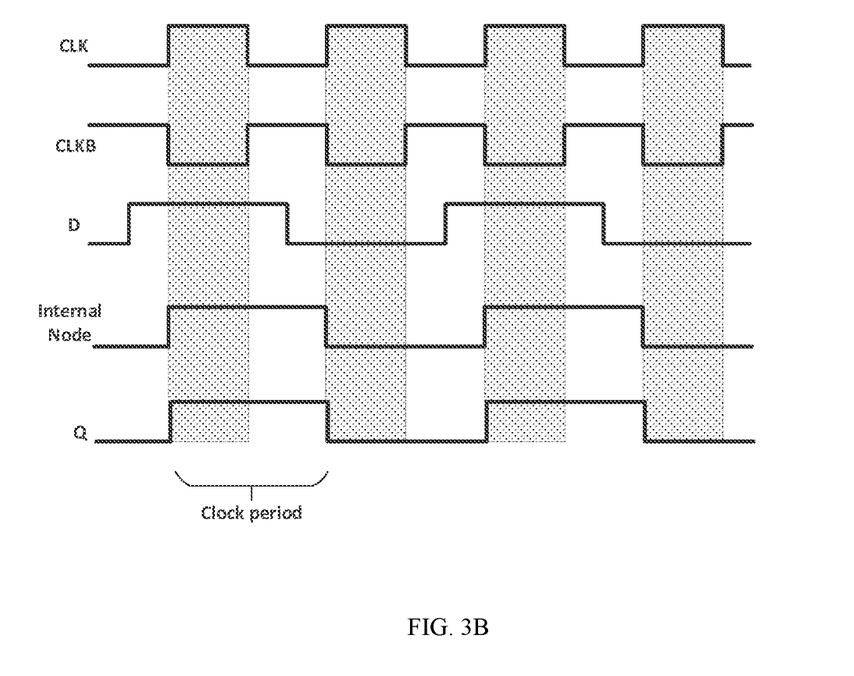
FIG. 3B is a diagram showing an example of input output signals of the static latch circuit of FIG. 3A.

FIG. 3B shows an example of voltage vs. time forms at the clock terminal ("CLK"), the inverted clock terminal ("CLKB"), the input terminal ("D"), the internal node, and the output terminal ("Q") of the latch circuit 300. As shown in FIG. 3B, voltage at the input terminal ("D") can only be captured and written to the internal node and the output terminal ("Q") when the clock signal "CLK" has a high voltage level (a binary "1"). The duration of the "reading" periods is illustrated by the shaded areas. Outside of the reading periods, the internal node and the output terminal ("Q") hold their signal levels regardless of the input signal.

Figure 4A:
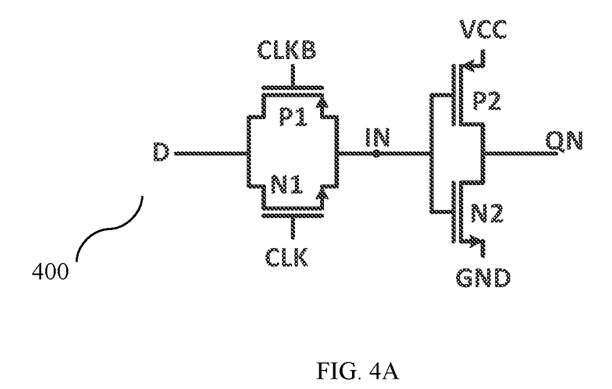
FIG. 4A is a diagram showing dynamic latch circuit according to some embodiments.

FIG. 4A shows a latch circuit 400 used in a register of an IC chip (e.g., ASIC chip) according to certain other embodiments. In certain embodiments, the latch circuit 400 may be a dynamic latch circuit. The dynamic latch circuit 400 may include a data input terminal ("D"), an inverted data output terminal ("QN"), a clock signal input terminal ("CLK"), an inverted clock signal input terminal ("CLKB"), a voltage high input terminal ("VCC"), and a ground terminal ("GND") terminal. The dynamic latch circuit 400 may include NMOS transistors N1 and N2 and PMOS transistors P1 and P2. The NMOS transistor N1 and PMOS transistor P1 may be connected in parallel to form a complementary transmission gate front-end circuit. That is, the two transistors N1 and P1 have their source terminals connected to the data input terminal D, and their drain terminals connected to a latch internal node IN. The gate terminal of N1 is connected to the clock input terminal CLK and the gate terminal of P1 is controlled by the inverted clock input terminal "CLKB". The transistors N2 and P2 may be connected to form an output inverter. The gate terminals of N2 and P2 may be connected to the internal node IN. The source terminal of P2 may be connected to VCC. The source terminal of N2 may be connected to GND. And the drain terminals of N2 and P2 may be connected to the inverted output terminal QN. It is noted that the dynamic latch circuit 400 only requires 4 transistors (including 2 clocked transistors) compared to the 10 transistors in the static latch circuit 300. Therefore, the dynamic latch circuit 400 has better power efficiency compared to the static latch circuit 300.

Figure 4B:
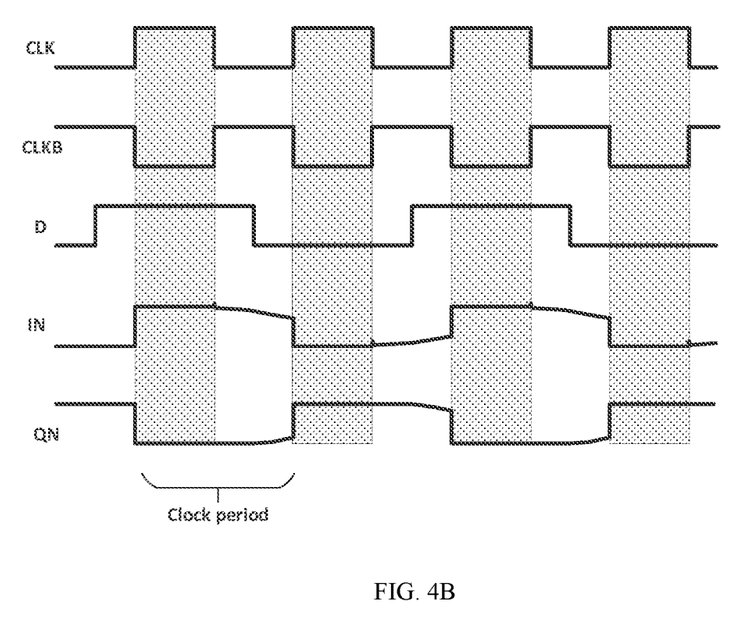
FIG. 4B is a diagram showing an example of input and output signals of the dynamic latch circuit of FIG. 4A.

FIG. 4B shows an example of voltage vs. time waveforms at the clock terminal ("CLK"), the inverse clock terminal ("CLKB"), the input terminal ("D"), the internal node ("IN"), and the inverted output terminal ("QN") of the latch circuit 400. As shown in FIG. 4B, voltage at the input terminal ("D") can only be captured and written to the internal node and the output terminal ("QN") when the clock signal "CLK" has a high voltage level (a binary "1"). The duration of the "reading" periods is illustrated by the shaded areas. Outside of the reading periods, the voltage at the internal node IN starts to drift from the read voltage due to leakage of transistors N1 and P1, until the CLK signal becomes binary "1" and the next "reading" period starts. For example, when a "1" is stored into the latch internal node IN, it is slowly discharged through transistor N1, and the stored state drifts toward the value on 'D' on the other side of the transmission gate. The inverted output terminal QN outputs a rectified and inverted signal of the voltage at IN, which also shows slow deviation from the stored state outside the "reading" periods. The latch internal state is not indefinitely held to its value when CLK=0, so if not refreshed periodically, it will eventually lose the stored state when the voltage drifts off the stored value. Thus, there is a maximum interval during which the latch needs to be refreshed, and there is a minimum frequency constraint for operating these dynamic latches. The maximum interval and the minimum frequency depend on the discharging rate of transistors N1 and P1. In certain embodiments, the discharge rates may be reduced by reducing the subthreshold leakage in the transmission gate of the transistors. In certain embodiments, this may be implemented by increasing channel length, increasing threshold voltage, or a combination of both. Depending on the circuit and transistor design, in certain embodiments, the maximum interval is less than 1 ns. In certain other embodiments, the maximum interval is between 1 ns-2 ns, between 2 ns-5 ns, between 5 ns-10 ns, or between 10 ns-20 ns. In certain embodiments, the maximum interval is greater than 20 ns. In certain embodiments, the maximum interval is between 10 ns-100 ns.

According to some embodiments, the latch circuit 400 may be operated at a low voltage or at a voltage close to a threshold voltage. As an example, in certain embodiments, the latch circuit 400 of the IC chip data register may efficiently operate at a low voltage at around 400 mV. As another example, in certain embodiments, the latch circuit 400 of the IC chip data register may efficiently operate at a low voltage at around 250 mV. By optimizing the circuit for low-voltage operation, improved power efficiency of the data register element may be realized.

Figure 5A:
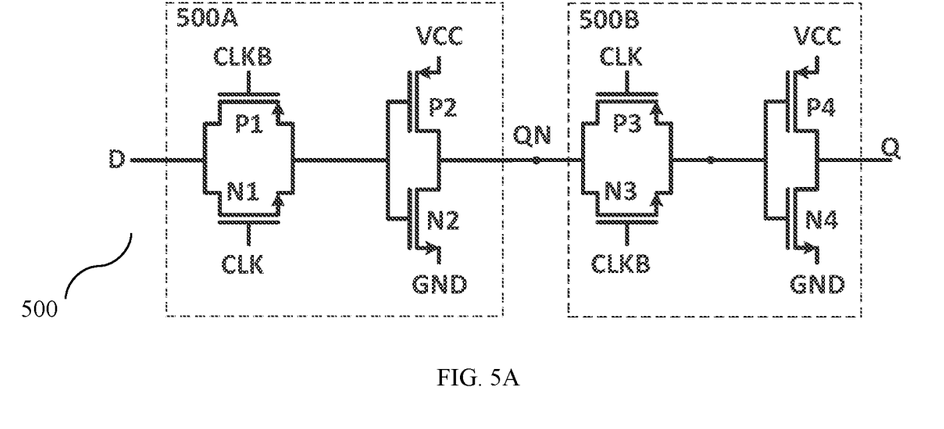
FIG. 5A is a diagram showing dynamic flip-flop circuit according to some embodiments.

FIG. 5A shows a dynamic flip-flop circuit 500 circuit based on the dynamic latch circuit 400 shown in FIG. 4A. As shown in FIG. 5, the dynamic flip-flop circuit 500 may include a first dynamic latch circuit 500A connected in series with a second dynamic latch circuit 500B having an opposite clock connection. The first latch circuit 500A may be termed as a "master" latch, and the second latch circuit 500B may be termed as a "slave" latch. The "master" latch 500A may include a data input terminal ("D"), a clock signal input terminal ("CLK"), an inverted clock signal input terminal ("CLKB"), a voltage high input terminal ("VCC"), and a ground terminal ("GND") terminal. The output of the master latch circuit 500A may be connected to an input of the slave latch circuit 500B. The slave latch circuit 500B further includes an output terminal ("Q").

Figure 5B:
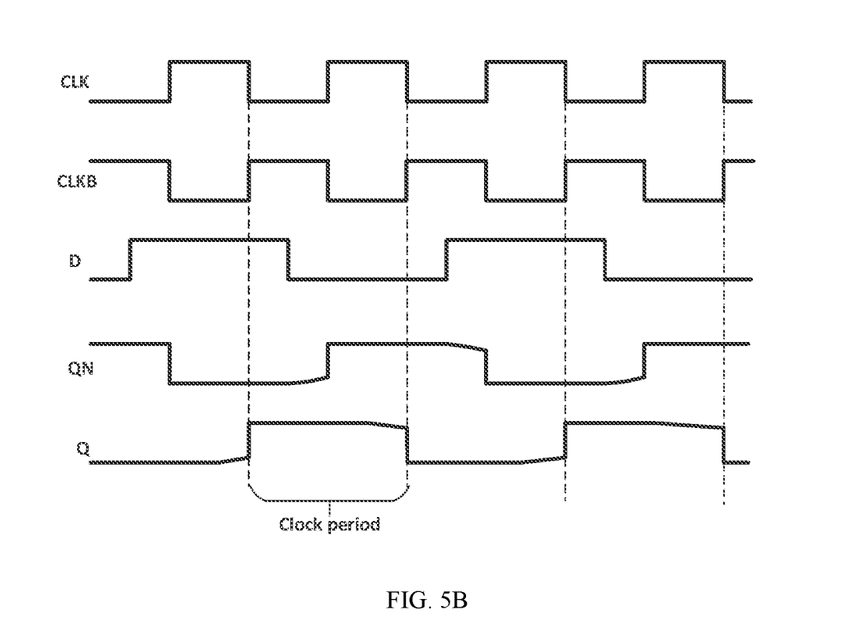
FIG. 5B is a diagram showing an example of input and output signals of the dynamic flip-flop circuit of FIG. 5A.

FIG. 5B shows an example of voltage vs. time waveforms at the clock terminal ("CLK"), the inverse clock terminal ("CLKB"), the input terminal ("D"), the inverted output terminal from the first latch circuit ("QN"), and the output terminal ("Q") of the dynamic flip-flop circuit 500. As shown in FIG. 5B, since the slave 500B has an inverted clock connection, its state is updated to follow the output of the master latch 510A when the clock signal has a low voltage (i.e., a binary "0" clock signal). Thus, the output of the slave latch Q is updated at the falling edge of the clock signal (as shown by the dashed lines).

Figure 6A:
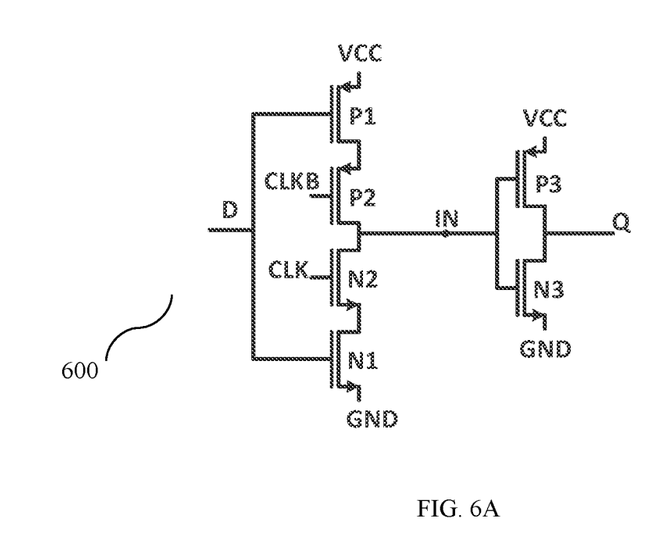
FIG. 6A is a diagram showing dynamic latch circuit according to some embodiments.

FIG. 6A shows a latch circuit 600 used in a register of an IC chip (e.g., ASIC chip) according to certain other embodiments. In certain embodiments, the latch circuit 600 may be a dynamic latch circuit. The dynamic latch circuit 600 may include a data input terminal ("D"), a data output terminal ("Q"), a clock signal input terminal ("CLK"), an inverted clock signal input terminal ("CLKB"), a voltage high input terminal ("VCC"), and a ground terminal ("GND") terminal. The dynamic latch circuit 600 may include NMOS transistors N1, N2, and N3, and PMOS transistors P1, P2, and P3. The NMOS transistor N1 and N2 and PMOS transistor P1 and P2 may be connected in series to form a tri-state inverter front-end circuit. The input terminal D may be connected to the gate terminals of P1 and N1. The gate terminal of N2 may be connected to the clock input terminal CLK. The gate terminal of P2 may be connected the inverted clock input terminal "CLKB". The source terminal of P1 may be connected to VCC. The source terminal of N1 may be connected to GND. The drain terminal of P1 may be connected to the source terminal of P2. And the drain terminal of N1 may be connected to the source terminal of N2. The drain terminal of N2 and the drain terminal of P2 may be connected to an internal node (IN).

Figure 6B:
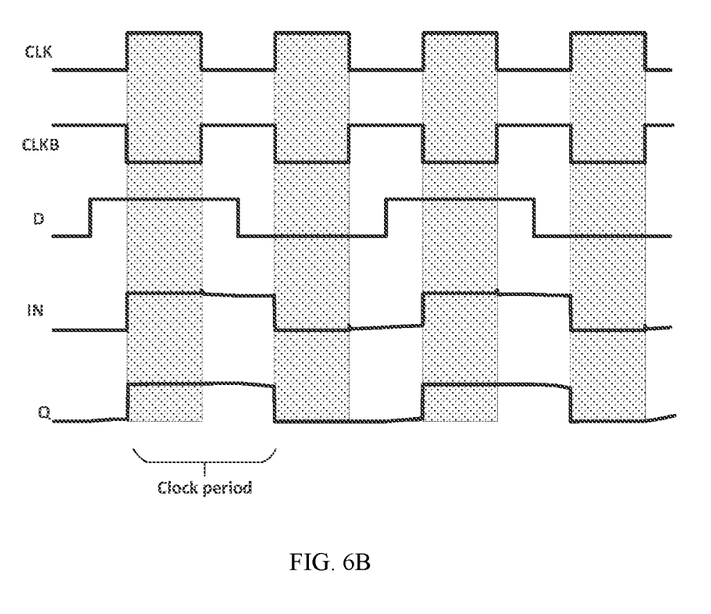
FIG. 6B is a diagram showing an example of input and output signals of the dynamic latch circuit of FIG. 6A.

FIG. 6B shows an example of voltage vs. time waveforms at the clock terminal ("CLK"), the inverse clock terminal ("CLKB"), the input terminal ("D"), the internal node ("IN"), and the output terminal ("Q") of the latch circuit 600. As shown in FIG. 6B, voltage at the input terminal ("D") can only be captured and written to the internal node and the output terminal ("Q") when the clock signal "CLK" has a high voltage level (a binary "1"). The duration of the "reading" periods is illustrated by the shaded areas. Outside of the reading periods, the voltage at the internal node IN starts to drift from the read voltage due to leakage of transistors N1 and P1. The transistors N1, N2, P1, and P2 provide additional signal gain. Therefore, the latch circuit 600 may have a better performance holding the stored state compared to the latch circuit 400. For example, the latch circuit 600 may have an increased maximum interval during which the latch needs to be refreshed, and a smaller minimum frequency constraint for operation. In certain other embodiments, the maximum interval is between 1 ns -2 ns, between 2 ns-5 ns, between 5 ns-10 ns, or between 10 ns-20 ns. In certain embodiments, the maximum interval is greater than 20 ns. In certain embodiments, the maximum interval is between 10 ns-100 ns.

In certain embodiments, a dynamic flip-flop circuit may be formed based on the dynamic latch circuit 600. The dynamic flip-flop circuit may include a first dynamic latch circuit connected in series with a second dynamic latch circuit having an inverted clock connection. The first and second dynamic latch circuits may have the same structure as dynamic latch circuit 600. The first latch circuit may be termed as a "master" latch, and the second latch circuit may be termed as a "slave" latch. The "master" latch may include a data input terminal ("D"), a clock signal input terminal ("CLK"), an inverted clock signal input terminal ("CLKB"), a voltage high input terminal ("VCC"), and a ground terminal ("GND") terminal. The output of the master latch circuit may be connected to an input of the slave latch circuit. The slave latch circuit further includes an output terminal ("Q"). Since the slave latch circuit has an inverted clock connection, its state is updated to follow the output of the master latch when the clock signal has a low voltage (i.e., a binary "0" clock signal). Thus, the output of the slave latch Q is updated at the falling edge of the clock signal.

The above dynamic latch circuits and flip-flop circuits are only some examples of dynamic latches and flip-flop circuits. Other circuit variations of dynamic latch and flip-flop circuits may be derived based on the working principles of the above embodiments, and are within the scope of the present disclosure.

In certain embodiments, data registers may be formed based on the dynamic latches and/or flip-flop circuits as shown in FIGS. 4A-6B and described above. For example, a plurality of dynamic latches and/or flip-flop circuits including dynamic latches 400 (shown in FIG. 4A) and 600 (shown in FIG. 6A) and/or flip-flop circuits such as 500 (shown in FIG. 5A) may be organized to form a data register similar to the structure shown in FIG. 2A.

In certain embodiments, an IC chip may be formed including storage elements based on the dynamic latch and/or flip-flop circuits as shown in FIGS. 4A-FIG. 6B and described above. The IC chip may have a similar structure as shown in FIG. 1A and FIG. 1B. As shown in FIG. 1A and FIG. 1B, the IC chip 100 may include an input/output component (e.g., chip I/O), a phase-locked loop (PLL) component, a top control component, one or more independent processing cores, and two voltage terminals (e.g., VDD terminal and VSS terminal). In certain embodiments, the PLL component may be configured to generate one or more clock signals. The PLL component may further be configured to send the generated one or more clock signals to the one or more independent processing cores 110. An independent processing core may independently read and execute program instructions. The independent processing core may also be termed as a processing unit. In the present disclosure, the terms "independent processing core", "processing core", and "processing unit" may be used interchangeably. In certain embodiments, the IC chip 100 may include a plurality of processing cores (or processing units) 110. That is, IC chip 100 may be a multi-core processor.

In some embodiments, each independent processing core 110 may be configured to receive, at a terminal 102, at least one of the one or more clock signals from the PLL component. Each independent processing core 110 may be further configured to receive, at terminal 104, signals from the top control component. In certain other embodiments, each independent processing core may be further configured to receive, at terminal 104, signals from another independent processing core. The received signals may include data signals, control signals and/or core input/output (I/O) signals. In certain embodiments, each independent processing core may be further configured to send, from terminal 106, signals to the top control component. In certain embodiments, the sent signals may include data signals, control signals and/or core I/O signals.

In certain embodiments, the top control component may be configured to receive signals from and/or send signals to each independent processing core. For examples, the received signals and/or sent signals may include data signals, control signals and/or core I/O signals. In certain embodiments, the top control component may further be configured to receive signals from and/or send signals to the input/output component. In certain embodiments, the received signals and/or sent signals may include data signals.

In certain embodiments, the processing core 110 may include a pipeline configured to process an input data stream. The pipeline may include a plurality of consecutive stages. In one example, the independent processing core may include 128 pipeline stages (e.g., stage 0, . . . , and stage 127). In certain embodiments, each pipeline stage may include a data register ("regs") 108. In certain embodiments, each pipeline stage may further include a logic component 109.

In certain embodiments, the register 108 and the logic component 109 of the first stage may be connected to the terminal 104 of the independent processing core and configured to receive data signals from the top control component through terminal 104. After being processed by the logic component 109 of the first stage, the data signals may be passed on to the register 108 and logic component 109 of the next stage, and so on, until the data signals are processed by the logic component 109 of the last stage and sent to terminal 106. According to certain embodiments, the processing core 110 may include one or more delay buffers for the clock signal. Clock signals may be delayed at each delay buffers before being sent to the data register 108 at the corresponding stage. As shown in FIG. 1B, the propagation direction of the clock signals may be opposite of the propagation direction of the data signals. That is, while the data signals propagate from the first stage to the last stage of the pipeline, the clock signals may propagate from the last stage to the first stage of the pipeline through the corresponding delay buffers at each stage.

According to certain embodiments, the logic component 109 of the last stage in the pipeline may be connected to terminal 106 of the independent processing core. In certain embodiments, the logic component 109 of the last stage may be configured to process the data received from the register of the last stage and send the processed data to the terminal 106 to be outputted to the top control component.

In certain embodiments, the data register 108 may include one or more data storage elements. The data storage element may include a dynamic latch or a dynamic flip-flop as shown in FIGS. 4A-6B and in the forgoing description. The details of the dynamic latches and dynamic flip-flops are not repeated again. In certain examples, each of the one or more stages of the pipeline includes a logic component ("logic").

In certain embodiments, the pulse generator of the first stage (e.g., stage 0) may be connected to the terminal 102 of the independent processing core and configured to receive the clock signal from the PLL component through the terminal 102. The register of the last stage in the pipeline may be connected to the terminal 104 of the independent processing core and configured to receive signals ("input data") from the top control component through terminal 104. The clock terminal ("clock") of the register of a particular stage may be connected to the pulse generator of the particular stage.

According to certain embodiments, the logic component of the first stage (e.g., stage 0) in the pipeline is connected to terminal 106 of the independent processing core. The logic component of the first stage (e.g., stage 0) may be configured to process the data received from the register of the first stage (e.g., stage 0) and send the processed data to the terminal 106 to be outputted to the top control component.

Figure 7A:
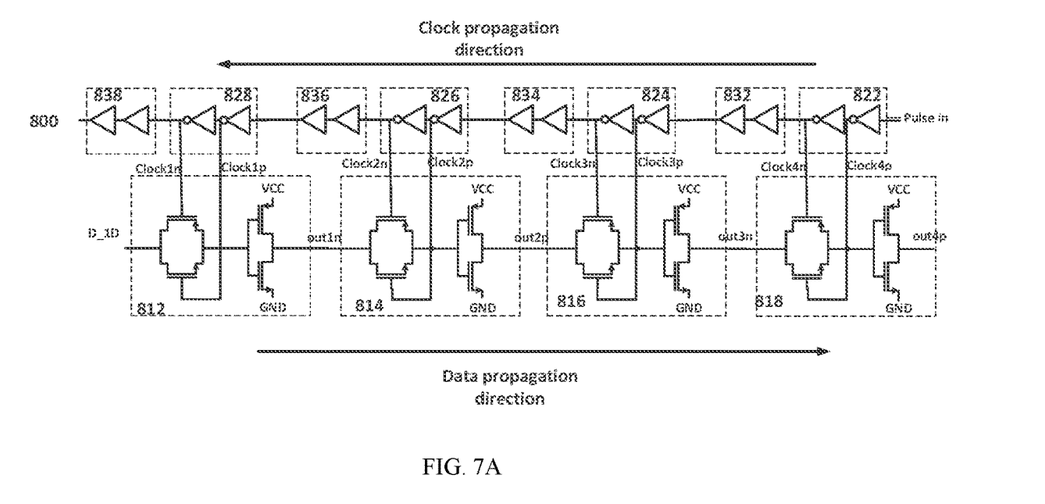
FIG. 7A is diagram showing a data storage pipeline circuit according to certain embodiments.

FIG. 7A shows a data storage pipeline circuit of a processing core according to certain embodiments. As shown in FIG. 8A, the data storage circuit may include a plurality of dynamic latches, serving as data storage units, such as 812, 814, 816, and 818. Clock signals are provided to the dynamic latches by a plurality of clock buffers such as 822, 824, 826, and 828 and a plurality of delay buffers as 832, 834, 836, and 838. The clock signals are delayed at each delay buffers, with a clock propagation direction from right to left. The plurality of dynamic latches may be sequentially connected with a data propagation direction from left to right. Although not shown in FIG. 8A, data logic units may be included between the data storage units as shown in FIG. 1B. Further, although in the circuit shown in FIG. 7A, the dynamic latches 812, 814, 816, and 818 have a circuit structure of the dynamic latch of FIG. 4A, in certain other embodiments, the dynamic latches may have other circuit structures, such as the dynamic latch of FIG. 6A.

Figure 7B:
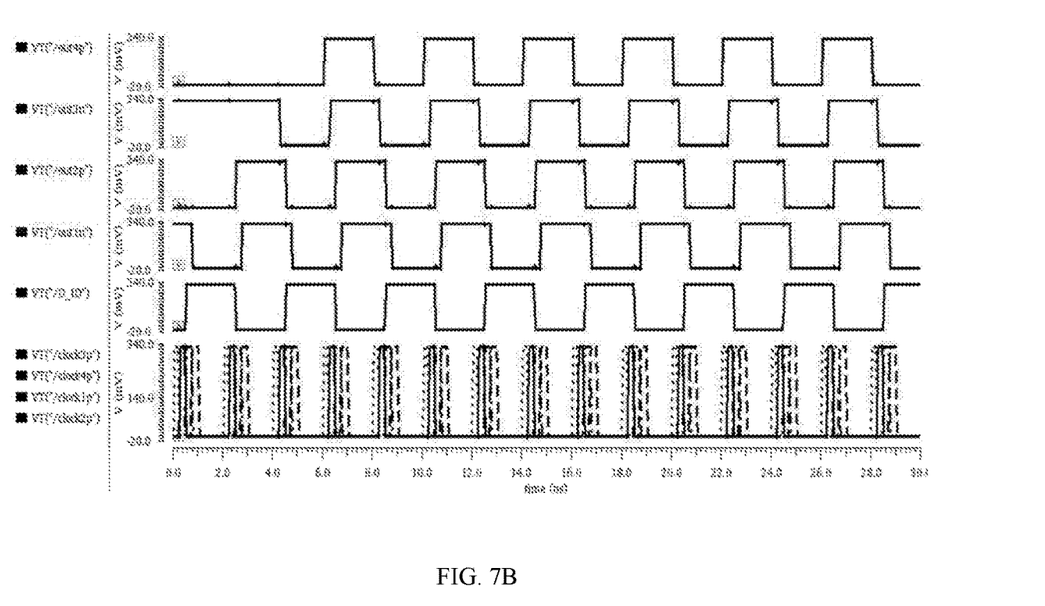
FIG. 7B is a diagram showing an example of input and output signals of the data storage pipeline circuit of FIG. 7A.

FIG. 7B shows waveforms at different points of the storage circuit shown in FIG. 7A. As shown in FIG. 7B, the clock signals (as shown in the bottom panel) are isolated from each other by delays, which prevents them from overlapping. Thus, the data only moves one stage per clock cycle. As shown in the top 4 waveform panels of FIG. 7B, the outputs (out1$n$, out2$p$, out3$n$, and out4$p$) of the dynamic latches 812, 814, 816, and 818 have a data propagation direction from left to right. In other words, in certain embodiments, the pipeline may be structured with the clock signal moving in the opposite direction of the data signals. This ensures that there are non-overlapping clocks and that the data can only move one stage each time a pulse arrives.

In certain embodiments, the forgoing IC chip in the forgoing description may be used to perform Hash calculations in block-chain related applications, such as a cryptocurrency mining process, where a large amount of computation may be required. By reducing the number of transistors in the data storage elements and optimizing the data storage circuit for low-voltage operation, improved power efficiency and size reduction of the IC chip may be realized. Further, in cryptocurrency mining applications, the minimum frequency constraint may be mitigated by the nature of the mining application, where each functional unit, core, and even chip remains active most of the time. Further, the non-overlapping clock requirement may be mitigated by the deep pipelines and simple clock networks of cryptocurrency ASICs.

The forgoing description and embodiments are exemplary descriptions of the technical solutions provided by the present disclosure. Other embodiments of the disclosure will be apparent to those skilled in the art. The present disclosure is intended to cover any variations, modifications, equivalent substitutions, uses, or adaptations that are in accordance with the general principles of the present disclosure.

What is claimed is:

1. An integrated circuit (IC) chip, comprising:
a plurality of data storage elements arranged in a plurality of circuit stages, each circuit stage having one of the data storage elements, and each data storage including a dynamic latch circuit; and
a plurality of clock delay buffer circuits;
wherein:
    each dynamic latch circuit includes a first NMOS transistor, a second NMOS transistor, a first PMOS transistor, and a second PMOS transistor;
    a source terminal of the first NMOS transistor is connected to a source terminal of the first PMOS transistor to form a data input terminal;
    a drain terminal of the first NMOS transistor is connected to a drain terminal of the first PMOS transistor to form a latch internal node;
    a gate terminal of the first NMOS transistor is connected to a clock input signal;
    a gate terminal of the first PMOS transistor is connected to an inverse clock input signal;
    a gate terminal of the second NMOS transistor and a gate terminal of the second PMOS transistor are connected to the latch internal node;
    a drain terminal of the second NMOS transistor and a drain terminal of the second PMOS transistor are connected to form an inverted output terminal;
    each circuit stage receives a clock signal from a corresponding clock delay buffer circuit to cause the plurality of data storage elements to be controlled by non-overlapping clock signals; and
    the plurality of circuit stages are sequentially connected to each other to pass data in a first direction.

2. The IC chip according to claim 1, wherein:
the non-overlapping clock signals received by the plurality of circuit stages have a propagation direction opposite to the first direction.

3. The IC chip according to claim 1, further comprising a plurality of logic circuit elements connected to the plurality of data storage elements.

4. The IC chip according to claim 1, wherein the IC chip is an ACIS chip customized for cryptocurrency mining calculations.

5. The IC chip according to claim 1, wherein:
the dynamic latch circuit is configured to read a signal from the data input terminal and pass a logic state of the read signal to the latch internal node when the clock input signal has a high logic state.

6. The IC chip according to claim 5, wherein:
the dynamic latch circuit is configured to store the logic state of the read signal at the latch internal node for a finite period of time.

7. The IC chip according to claim 6, wherein:
the finite period of time is determined according to leakage properties of the first NMOS transistor and the first PMOS transistor.

8. The IC chip according to claim 1, wherein:
the dynamic latch circuit is a first dynamic latch circuit;
each data storage device further comprises a second dynamic latch circuit; and
the first dynamic latch circuit and the second dynamic latch circuit form a dynamic flip-flop circuit.

9. The IC chip according to claim 8, wherein:
the dynamic flip-flop circuit is configured to read a signal from the data input terminal of the first dynamic latch circuit at a positive or negative edge of the clock input signal.

10. An integrated circuit (IC) chip, comprising:
a plurality of data storage elements arranged in a plurality of circuit stages, each circuit stage having one of the data storage elements, and each data storage including a dynamic latch circuit; and
a plurality of clock delay buffer circuits;
wherein:
    the dynamic latch circuit includes a first NMOS transistor, a second NMOS transistor, a third NMOS transistor, a first PMOS transistor, a second PMOS transistor, and a third PMOS transistor;
    the first NMOS transistor, the second NMOS transistor, the first PMOS transistor, and the second PMOS transistor are connected in series to from a pass-gate front-end circuit to pass a signal from a data input terminal to a latch internal node;
    a gate terminal of the third NMOS transistor and a gate terminal of the third PMOS transistor are connected to the latch internal node;
    a drain terminal of the third NMOS transistor and a drain terminal of the third PMOS transistor are connected to form an output terminal;
    each circuit stage receives a clock signal from a corresponding clock delay buffer circuit to cause the plurality of data storage elements to be controlled by non-overlapping clock signals; and
    the plurality of circuit stages are sequentially connected to each other to pass data in a first direction.

11. The IC chip according to claim 10, wherein:
the non-overlapping clock signals received by the plurality of circuit stages have a propagation direction opposite to the first direction.

12. The IC chip according to claim 10, further comprising a plurality of logic circuit elements connected to the plurality of data storage elements.

13. The IC chip according to claim 10, wherein the IC chip is an ACIS chip customized for cryptocurrency mining calculations.

14. The IC chip according to claim 10, wherein:
the dynamic latch circuit is configured to read the signal from the data input terminal and pass a logic state of the read signal to the latch internal node when the clock input signal has a high logic state.

15. The IC chip according to claim 14, wherein:
the dynamic latch circuit is configured to store the logic state of the read signal at the latch internal node for a finite period of time.

16. The IC chip according to claim 15, wherein:
the finite period of time is determined according to leakage properties of the first NMOS, the second NMOS transistor, the first PMOS transistor, and the second PMOS transistor.

17. The IC chip according to claim 10, wherein:
the dynamic latch circuit is a first dynamic latch circuit;
each data storage device further comprises a second dynamic latch circuit; and
the first dynamic latch circuit and the second dynamic latch circuit form a dynamic flip-flop circuit.

18. The IC chip according to claim 17, wherein:
the dynamic flip-flop circuit is configured to read a signal from the data input terminal of the first dynamic latch circuit at a positive or negative edge of the clock input signal.

\* \* \* \* \*